(12) United States Patent
Shimizu et al.

(10) Patent No.: US 6,714,047 B2
(45) Date of Patent: Mar. 30, 2004

(54) SEMICONDUCTOR INTEGRATED CIRCUIT

(75) Inventors: Tadayuki Shimizu, Tokyo (JP);
Masaki Tsukude, Tokyo (JP);
Takafumi Takatsuka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/266,757

(22) Filed: Oct. 9, 2002

(65) Prior Publication Data

US 2003/0193349 A1 Oct. 16, 2003

(30) Foreign Application Priority Data

Apr. 12, 2002 (JP) ........................................ 2002-110786

(51) Int. Cl.[7] .......................................... H03K 19/0185
(52) U.S. Cl. .............................. 326/62; 326/63; 326/68; 326/80; 327/112; 327/333
(58) Field of Search .............................. 326/62, 63, 68, 326/80, 81, 86, 90; 327/333, 112, 374, 379

(56) References Cited

U.S. PATENT DOCUMENTS 6,166,580 A * 12/2000 Sessions ...................... 327/333
6,255,888 B1 * 7/2001 Satomi ........................ 327/333
6,501,306 B1 * 12/2002 Kim et al. ................... 327/112

FOREIGN PATENT DOCUMENTS

JP            7-282585         10/1995

* cited by examiner

*Primary Examiner*—Vibol Tan
(74) *Attorney, Agent, or Firm*—McDermott, Will & Emery

(57) ABSTRACT

The semiconductor integrated circuit incudes an input circuit which receives a signal, an internal circuit which applies a predetermined function to the received signal, and an output circuit which outputs the signal applied with the predetermined function. An external power supply voltage VDD and an IO power supply voltage VDDQ which is lower than the voltage VDD are supplied to the semiconductor integrated circuit. A voltage VIO obtained by decreasing the external power supply voltage VDD is supplied to the input circuit. The IO power supply voltage VDDQ is supplied to the output circuit.

11 Claims, 11 Drawing Sheets

SEMICONDUCTOR INTEGRATED CIRCUIT

BACKGROUND OF THE INVENTION

1. Field of the Invention

The present invention relates to a semiconductor integrated circuit, and in particular to a circuit having an input buffer, an internal circuit and an output buffer, in which a power supply voltage supplied to the internal circuit is different from power supply voltages supplied to the input and output buffers.

2. Related Art

FIG. 13 shows a circuit configuration of conventional semiconductor integrated circuit. As shown in FIG. 13, the semiconductor integrated circuit includes an input circuit 11 for receiving a data signal from outside, an internal circuit 15 for carrying out a processing corresponding to a predetermined function of the semiconductor integrated circuit and an output circuit 13 for generating from a data signal received from the internal circuit 15 a signal to be outputted to a subsequent circuit.

As a whole, a low power supply voltage is preferably supplied to such semiconductor integrated circuit in view of recent demand of low consumption power. When the power supply voltage is decreased, there arises a problem in that sufficient performance of the internal circuit 15 cannot be obtained. Therefore, there is a method that while a high power supply voltage is supplied to the internal circuit, a low power supply voltage is supplied, as an IO power supply, to the input circuit and the output circuit.

For example, in the example shown in FIG. 13, a high power supply voltage VDD (e.g., 3.0V) is supplied to the internal circuit 15. A power supply voltage VDDQ (e.g., 1.8V) which is lower than the power supply voltage VDD is supplied, as a power supply for Input/Output, to the input circuit 11 and the output circuit 13.

Nevertheless, there arises a problem in that even though low power supply voltage is fed to the input circuit as described above, when an input signal is fed to the input circuit, a threshold of the input signal greatly varies.

SUMMARY OF THE INVENTION

The present invention is developed in order to solve the above drawback and an object of the present invention is to provide a semiconductor integrated circuit which suppresses variation of threshold of input signal at an input circuit in the semiconductor integrated circuit which has the input circuit and an output circuit.

The present invention provides a semiconductor integrated circuit that comprises an input circuit that receives a signal, an internal circuit that applies a predetermined function to the received signal, and an output circuit that outputs the signal applied with the predetermined function. A first power supply voltage and a second power supply voltage which is lower than the first power supply voltage are supplied to the semiconductor integrated circuit from the outside. A voltage obtained by decreasing the first power supply voltage is supplied to the input circuit. The second power supply voltage is supplied to the output circuit. Thus, the power supply for the input circuit is separated from the power supply for the output circuit. Accordingly, an influence of power supply noise that is generated at the output circuit at a moment of outputting the data upon the input circuit can be excluded.

The semiconductor integrated circuit further may comprise a first step-down circuit that decreases the first power supply voltage, and a second step-down circuit that decreases the voltage obtained by the first step-down circuit. The voltage from the first step-down circuit is supplied to the internal circuit, and the voltage from the second step-down circuit is supplied to the input circuit. Thus, the respective desired voltages for the internal circuit and the input circuit can be obtained from the power supply voltage by two step-down circuits.

The voltage from the second step-down circuit may be within a range of a standard to a power supply voltage for input and output. Thus, a suitable voltage can be supplied as the power supply for the input circuit.

The second step-down circuit may comprise an NMOS transistor and decreases a voltage by using a threshold voltage of the NMOS transistor, resulting in easy manufacture of the second step-down.

In the semiconductor integrated circuit, during normal operation, the first power supply voltage may be supplied to the input circuit, while during an operation in a power down mode which is an operational mode for reducing current consumption within the integrated circuit, the second power supply voltage may be supplied to the input circuit. Thus, during the power down mode operation, generation of leak current due to variation of the power supply voltage can be suppressed, thereby achieving lower power consumption.

The semiconductor integrated circuit may further comprise a selection circuit that selects, as a power supply to be supplied to the input circuit, one of the first power supply voltage and the voltage which is obtained by decreasing the first power supply voltage. Thus, the semiconductor integrated circuit operable with two types of IO power supplies can be provided.

The input circuit may comprise a first buffer circuit that receives the first power supply voltage to operate and a second buffer circuit that receives the voltage obtained by decreasing the first power supply voltage to operate. The selection circuit may select one of these buffer circuits according to a power supply supplied to the input circuit. By selecting an appropriate buffer circuit depending on the power supply voltage, a more appropriate circuit depending on the power supply voltage can be operated in the semiconductor integrated circuit.

The selection circuit may select the power supply by a selection signal which is generated by electrically connecting an inner lead connected to a predetermined potential to a pad. Thus, the selection signal for controlling the selection circuit can be easily generated.

The selection circuit may select the power supply by a selection signal which is generated based on predetermined data recorded in a rewritable storage.

The rewritable storage may be provided within another integrated circuit but is molded in the same package or one chip.

The selection circuit may select the power supply by a selection signal which is generated in accordance with electrical disconnection of a fuse.

DESCRIPTION OF THE PREFERRED EMBODIMENTS

Hereinafter, embodiments of semiconductor integrated circuit according to the present invention will be described in detail with reference to the attached drawings. According to research and analysis, it is found that a threshold of input signal of input circuit varies greatly when data is outputted. Further, it is found that such phenomenon occurs because a power supply of the input circuit is the same as that of the output circuit in spite of a low power supply voltage and thus the input circuit is affected by a noise from the output circuit. Taking such points in consideration, structures shown in the following embodiments are devised.

First Embodiment

Figure 1:
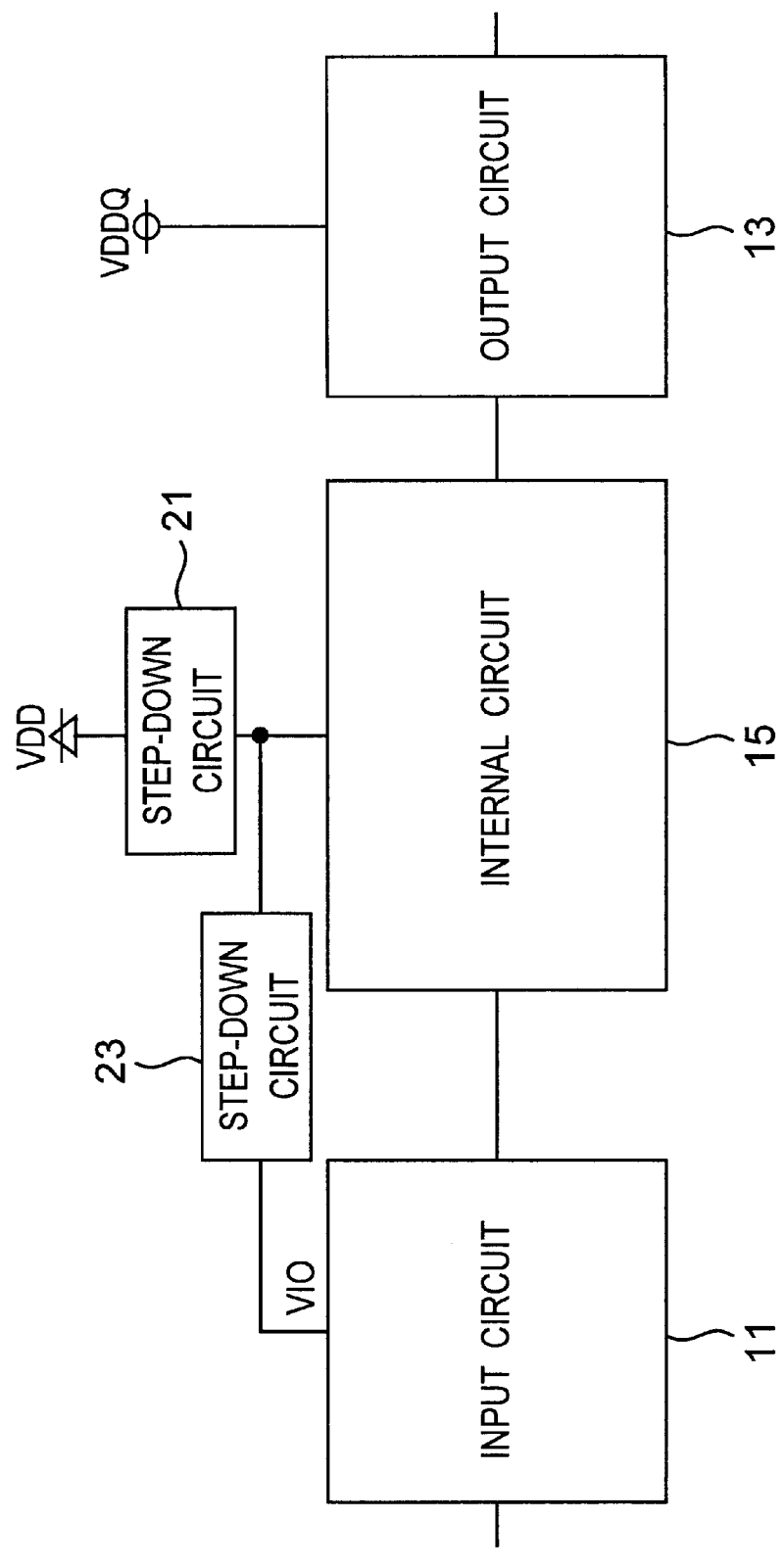
FIG. 1 shows a structural view of semiconductor integrated circuit according to a first embodiment of the present invention.

FIG. 1 shows a structure of semiconductor integrated circuit of the present invention. The semiconductor integrated circuit includes an input circuit 11 including an input buffer for receiving a data signal from outside, an internal circuit 15 which carries out a processing corresponding to a predetermined function of the semiconductor integrated circuit and an output circuit 13 including an output buffer for generating from the data signal received from the internal circuit 15 a signal to be outputted to a subsequent circuit. The semiconductor integrated circuit also includes step-down circuits 21 and 23.

The semiconductor integrated circuit of the present invention has two power supply input terminals to receive two types of voltages from outside as a driving power supply voltage. One of the two types of voltages is a voltage from a power supply ("external power supply") VDD which supplies a voltage (e.g., 3.0V) for driving the internal circuit. The other voltage is a voltage from a power supply ("IO power supply") VDDQ which supplies low voltage (e.g., 1.8V) for driving the input and output circuits.

As shown in FIG. 1, the IO power supply VDDQ is connected to the output circuit 13. A voltage (e.g., 2.5V) obtained by decreasing a voltage of the external power supply VDD at the step-down circuit 21 is supplied to the internal circuit 15. Further, a voltage VIO (e.g., 1.8V) which is obtained by further decreasing, at the step-down circuit 23, the voltage decreased at the step-down circuit 21 is supplied to the input circuit 11. The voltage VIO which is decreased at the step-down circuit 23 is controlled so as to be within a range of operational standard for the IO power supply.

As described above, a voltage from the IO power supply VDDQ which supplies a power to the semiconductor integrated circuit is supplied only to the output circuit 13, while a voltage from the external power supply VDD after decreased is supplied to the internal circuit 15 and the input circuit 11. That is, the power supply for the input circuit 11 is separated from the power supply for the output circuit 13, and thus even if a large noise is applied to the IO power supply VDDQ when the data is output from the output circuit 13, the power supply for the input circuit 11 is not affected by the noise. Thus, the problem such as variation in threshold of input signal included in the input circuit can be solved.

Figure 2:
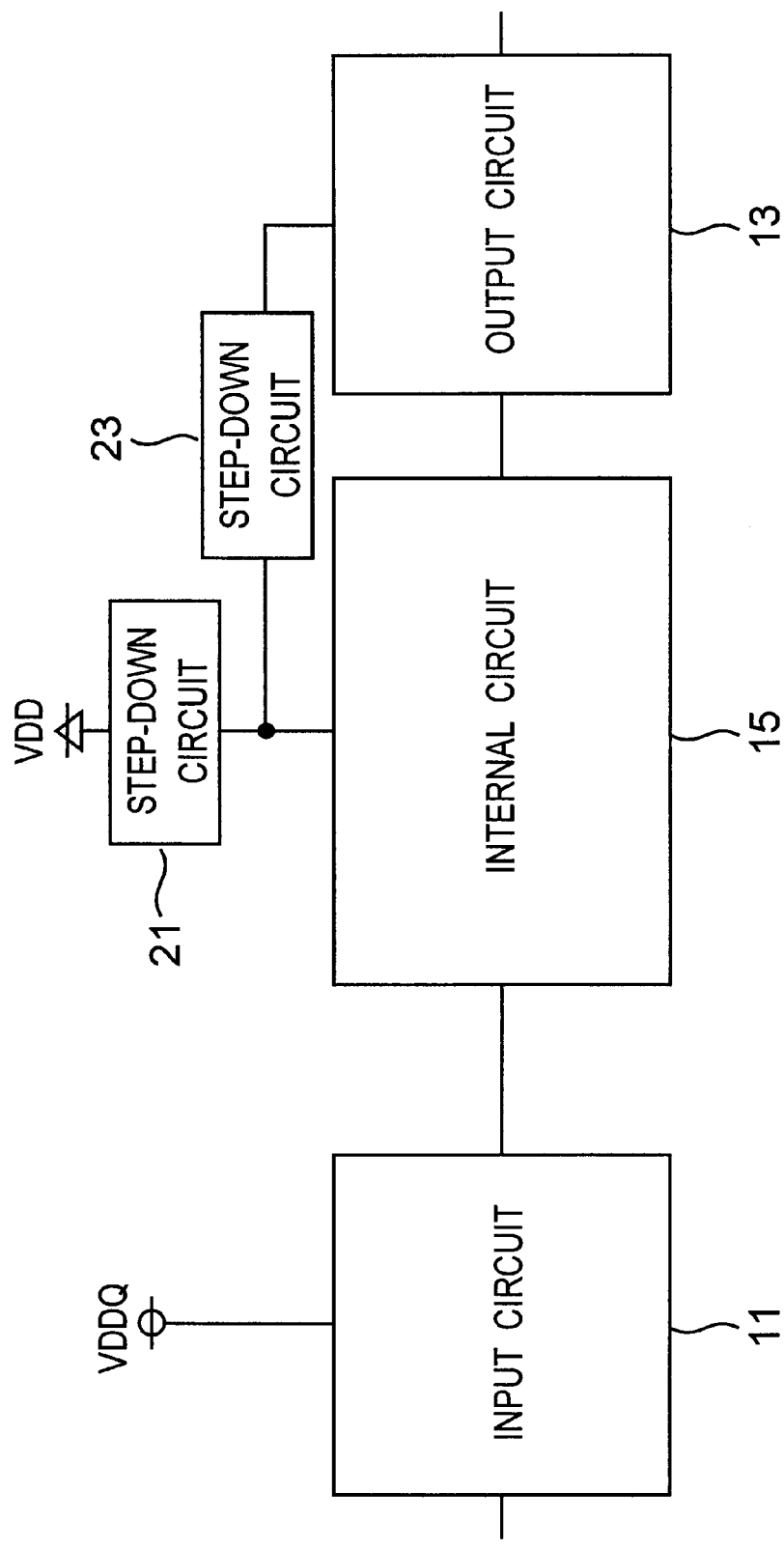
FIG. 2 is a view showing another structure of the semiconductor integrated circuit of the first embodiment.

As shown in FIG. 2, the IO power supply VDDQ may be connected to the input circuit 11, and the external power supply VDD may be connected via the step-down circuits 21 and 23 to the output circuit 13. In accordance with such configuration, the power supply for the input circuit 11 can be also separated from that for the output circuit 13, and the same effects as that of above-described case can be obtained.

Second Embodiment

Next, a description will be given to configuration and operation of a semiconductor integrated circuit having an operational mode to reduce consumption power in addition to the effects of the first embodiment.

Figure 3:
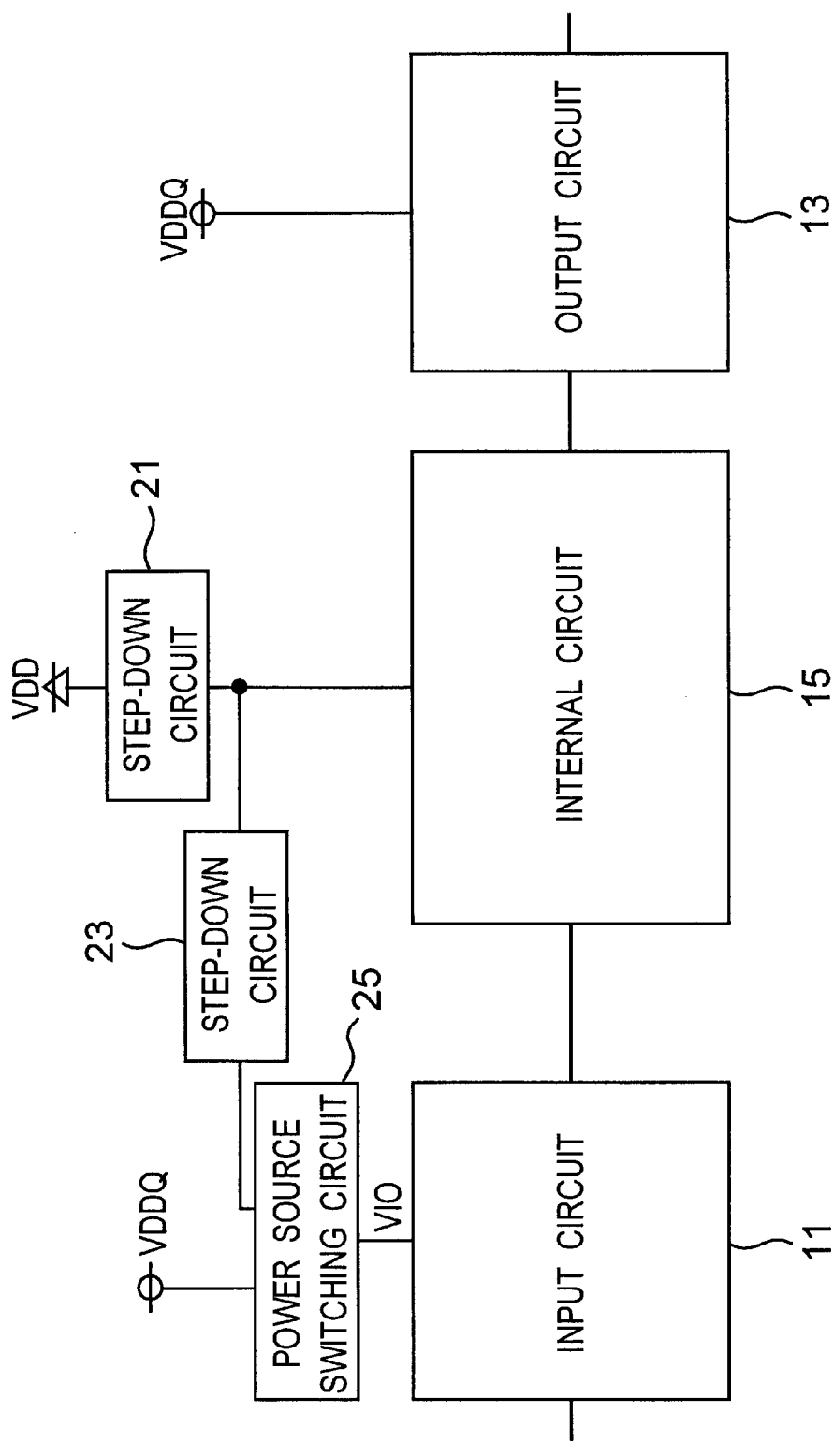
FIG. 3 is a structural view of the semiconductor integrated circuit according to a second embodiment of the present invention.

FIG. 3 shows a configuration of semiconductor integrated circuit according to a second embodiment. The semiconductor integrated circuit of the second embodiment includes, in addition to the configuration shown in FIG. 1, a power supply switching circuit 25.

The external power supply VDD via the step-down circuits 21 and 23 and IO power supply VDDQ are connected to the power supply switching circuit 25. The power supply switching circuit 25 selectively connects one of these two power supplies to the input circuit 11.

Figure 4:
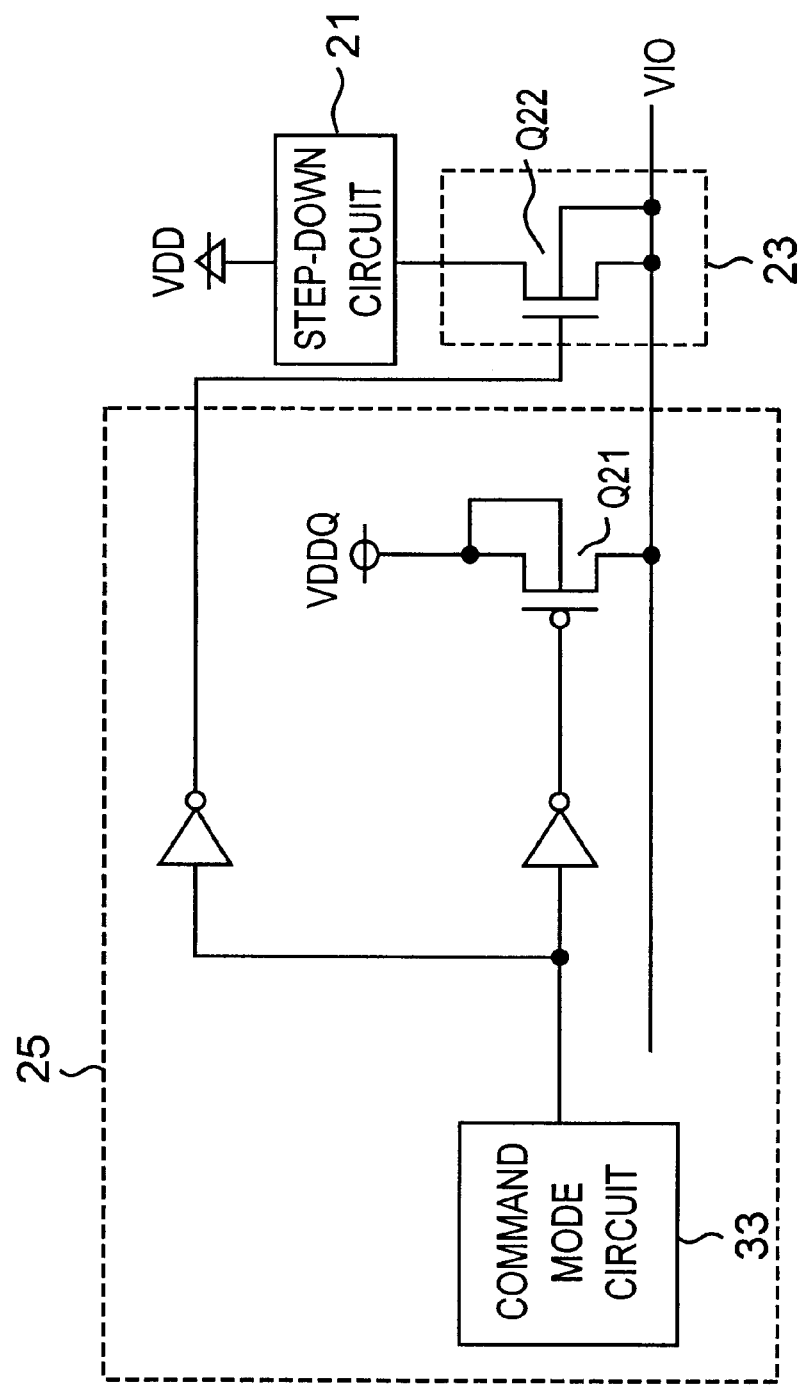
FIG. 4 is a view showing a detailed structure of power supply switching circuit.

FIG. 4 shows a detailed confituration of the power supply switching circuit 25. The power supply switching circuit 25 includes a command mode circuit 33 which outputs a predetermined control signal, a PMOS transistor Q21 which is connected to the IO power supply VDDQ, and an inverter. The step-down circuit 23 includes an NMOS transistor Q22, and decreases a voltage from the step-down circuit 21 by a threshold voltage of the transistor Q22.

The command mode circuit 33 outputs a control signal for realizing predetermined functions. Examples of the predetermined functions include a reset function and a power down function. In this embodiment, attention is particularly paid to the power down function. The power down function is a function for reducing power consumption of the semiconductor integrated circuit. When the power down function is operated (this operational mode is referred to as "power down mode"), power is supplied only to a minimum portion of the circuit which is required for power. Thus, the power consumption of the whole semiconductor integrated circuit can be reduced.

Hereinafter, an operation of the power supply switching circuit 25 will be described for a case of a normal operation and a case of a operation with a power down function, respectively. Assume that the voltage of the external power supply VDD is 3.0V, the voltage after being decreased at the step-down circuit 21 is 2.5V and the voltage of the IO power supply is 1.8V.

(1) During Normal Operation

During a normal operation mode, the command mode circuit 33 has the control signal "L (Low)". At this time, "H (High)" is input via the inverter to the transistor Q21 which then is turned off. Thus, the voltage of the IO power supply VDDQ is not transmitted to a power supply line VIO.

On the other hand, the control signal "H" is transmitted via the inverter to the transistor Q22 in the step-down circuit 23, and thus the transistor Q22 is turned on. Thus, a voltage obtained by decreasing, at the step-down circuit 21, the voltage of the external power supply VDD to the voltage of the IO power supply VDDQ, is supplied to the power supply line VIO. That is, when a threshold voltage value of the transistor Q22 is 0.7V, the voltage VIO is 2.5V−0.7V=1.8V. By utilizing the voltage VIO as the power supply for the input circuit 11, the power supply for the input circuit 11 can be separated from the power supply for the output circuit 13. Then, an influence of noise generated at a moment of outputting the data can be excluded in the input circuit. The step-down circuit 23 is formed by the transistor Q22 in order to reduce the circuit scale. Nevertheless, the step-down circuit 23 may have another configuration as long as on/off control can be performed from outside. Further, a value of the voltage VIO is preferably within a range which is appropriate for specification.

As described above, during the normal operational mode, the voltage obtained by decreasing the external power supply VDD is supplied to the input circuit 11.

(2) During Power Down Mode Operation

During the power down mode, the command mode circuit 33 has the control signal "H". At this time, "L" is input via the inverter to the transistor Q21 which then is turned on. Therefore, the voltage of the IO power supply VDDQ is supplied to the power supply line VIO.

The control signal "L" is transmitted via the inverter to the transistor Q22 of the step-down circuit 23, and thus the transistor Q22 is turned off. Thus, the voltage from the external power supply VDD is not supplied to the power supply line VIO.

As described above, during the power down mode, the voltage of the IO power supply VDDQ is supplied to the input circuit 11.

When the input circuit 11 is driven by the voltage obtained by decreasing the voltage of the external power supply VDD, an input signal depends on the external power supply VDD, and a driving power supply for the input circuit 11 depends on the IO power supply VDDQ. Namely, power supplies are different from each other. Therefore, when either power supply voltage is varied, a little potential difference is generated, leak current is generated a little, and current consumption is increased. Configurations shown in FIGS. 4 and 5 allow, during power down mode, the input data signal and the driving current to depend on the IO power supply VDDQ in the input circuit 11. When the power supply voltage varies, the input data signal and the driving current vary in the same manner. Thus, the potential difference is not generated, and it is possible to prevent a shot-through current in a buffer circuit included in a first stage in the input circuit.

Further, according to the above-described configuration, during the normal operation, an influence of noise for the input circuit can be excluded, while during the power down mode, the current consumption can be reduced.

Third Embodiment

Figure 5:
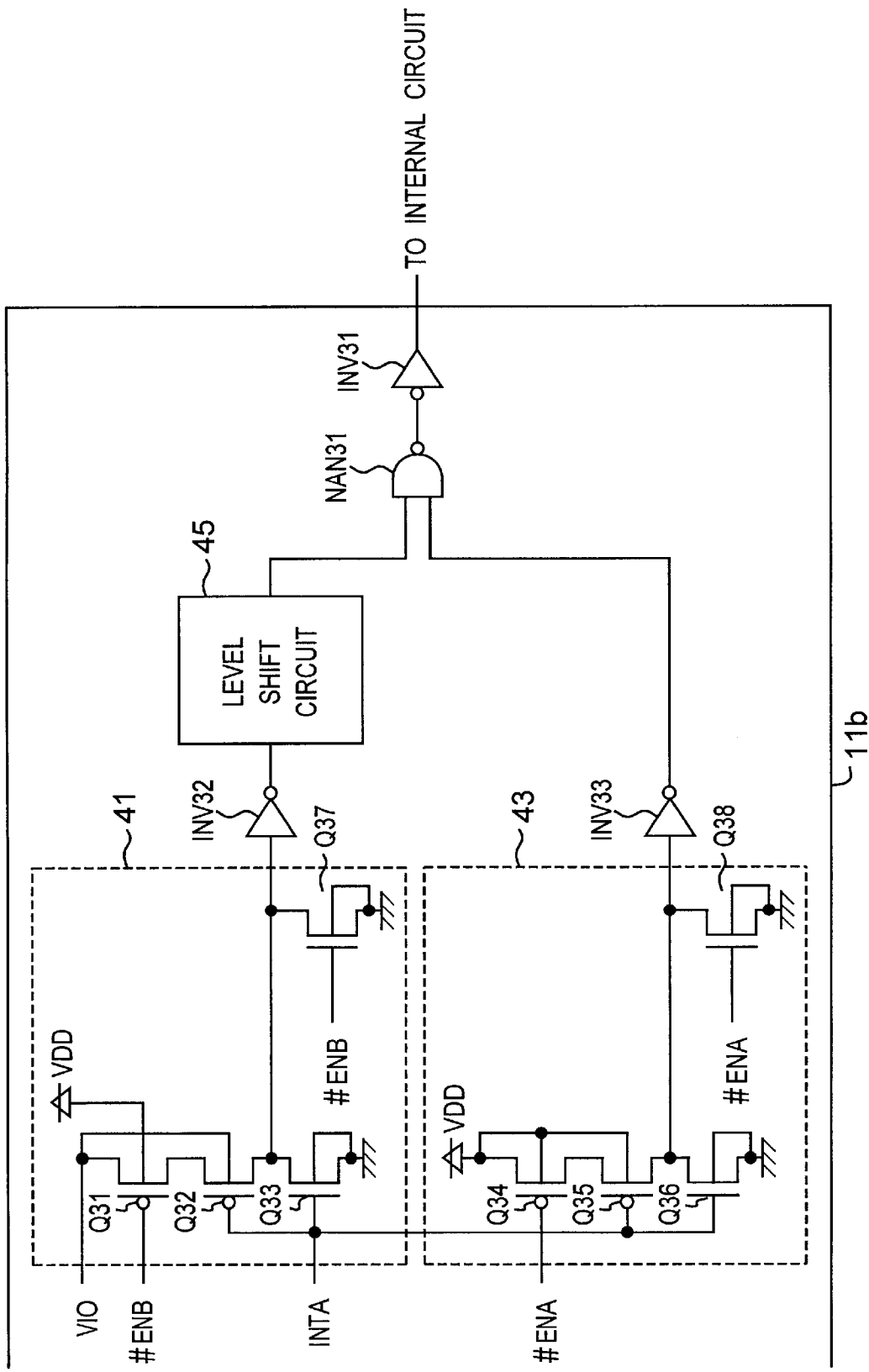
FIG. 5 is a view showing a structure of input circuit in the semiconductor integrated circuit according to a third embodiment of the present invention.

In a third embodiment, a description will be given of a semiconductor integrated circuit which is operable with two types of voltages from the external power supply and the IO power supply that serve as a power supply supplying to the input circuit. When a user uses the semiconductor integrated circuit of the third embodiment, the user selects one of these power supplies as the supplying a power supply voltage to the input circuit. FIG. 5 shows a configuration of input circuit of the semiconductor integrated circuit according to this embodiment. The input circuit 11b according to the this embodiment has two buffer circuits 41 and 43 that are suitable for operations at different power supply voltages.

The buffer circuit 41 is a circuit which is designed so as to operate optimally at a voltage VIO. As shown in the above-described embodiments, the voltage VIO is obtained by decreasing a voltage from the external power supply VDD and is equal to the IO power supply voltage. However in a case of the second embodiment, during the power down mode, the voltage VIO is a voltage of the external power supply VDD. The buffer circuit 43 is a circuit which is designed so as to optimally operate at a voltage of the external power supply VDD. When the semiconductor integrated circuit of the this embodiment is mounted to an electronic equipment and used, one of two buffer circuits 41 and 43 is selected by a user depending on applications.

The buffer circuit 41 includes PMOS transistor Q31 and Q32, and NMOS transistors Q33 and Q37. A size of each transistor is designed such that each transistor optimally operates at the voltage VIO which is obtained by decreasing a voltage from the external power supply VDD. The transistors Q32 and Q33 makes an input buffer. The transistor Q31 controls supply of the power supply voltage VIO, and the transistor Q37 controls transmission of data signal.

The buffer circuit 43 includes PMOS transistors Q34 and Q35, and NMOS transistors Q36 and Q38. A size of each transistor is designed such that each transistor optimally operates at the voltage of the external power supply VDD. The transistors Q35 and Q36 makes an input buffer. The transistor Q34 controls supply of the external power supply VDD, and the transistor Q38 controls transmission of data signal.

The buffer circuit 41 or 43 is selected by an enable signal #ENA or #ENB. A symbol "#" attached before a signal name indicates that the signal is operated at active low. The enable signal is generated by a signal generating circuit (which will be described later). A signal INTA is input to the buffer circuit 41 or 43 and then transmitted to a subsequent internal circuit. An output of the buffer circuit 41 is converted (step up) by a level shift circuit 45 into a signal level which is suitable for the internal circuit before transmitted to the subsequent internal circuit.

Operation of Semiconductor Integrated Circuit

Hereinafter, an operation of the semiconductor integrated circuit described above will be described.

(1) Case of Using Power Source Obtained by Decreasing a Voltage of External Power Source VDD as Driving Power Source for Input Circuit The enable signal #ENB is controlled so as to be active ("L"), and the enable signal #ENA is controlled so as to be inactive ("H").

In the buffer circuit 41, when the enable signal #ENB is active, the transistor Q31 is turned on and the operational voltage VIO is supplied to the input buffer formed of the transistors Q32 and Q33. At this time, the transistor Q37 is turned off because the enable signal #ENB is "L". Accordingly, the signal INTA is transmitted from the input buffer formed of the transistors Q32 and Q33 via the inverter INV 32 to the level shift circuit 45.

On the other hand, in the buffer circuit 43, the transistor Q34 is turned off because the enable signal #ENA is "H".

The transistor Q38 is turned on to output "L" to the inverter INV33. Then, the inverter INV33 outputs "H" to the NAND circuit NAN31.

As described above, as one input of the NAND circuit NAN31 is "H", the other input of the NAND circuit NAN31 is transmitted via the inverter INV31 to a subsequent circuit. Namely, an output from the buffer circuit 41 which is designed so as to be suitable for the operation at the voltage of the external power supply VDD is transmitted to the subsequent internal circuit 15.

(2) Case of Using External Power Source VDD as Driving Power Source for Input Circuit The enable signal #ENB is controlled so as to be inactive ("H") and the enable signal #ENA is controlled so as to be active ("L"). Thus, in the buffer circuit 43, the transistor Q34 is turned on and a voltage is supplied from the external power supply VDD to the input buffer formed of the transistors Q35 and Q36. The transistor Q38 is turned off. On the other hand, in the buffer circuit 41, the transistor Q31 is turned off. The transistor Q37 is turned on to output "L" to the inverter INV32.

As described above, the buffer circuit 43 which is designed so as to be suitable for the operation at the voltage of the external power supply VDD is selected. An output from the buffer circuit 43 is transmitted to the subsequent internal circuit 15.

In accordance with the above description, two buffer circuits corresponding to two types of power supply voltages are provided. When three or more types of power supply voltages are switched and used, three or more types of buffer circuits corresponding to the power supply voltages are provided, and then one buffer circuit is selected depending on an operational voltage to be used.

As described above, in accordance with the input circuit according to the third embodiment, the buffer circuit which is designed so as to be suitable for the driving power supply is used. Consequently, more efficient performance can be realized.

Generation of Enable Signal

Next, a circuit for generating enable signals #ENA and #ENB for selecting the buffer circuit 41 or 43 in the above-described input circuit 11b will be described. The circuit for generating the enable signals #ENA and #ENB to be described hereinafter may be provided within the semiconductor integrated circuit of the present invention. Alternatively, the circuit may be provided outside. At this case, the circuit is preferably molded together with the semiconductor integrated circuit of the present invention to be stored in the same package.

Figure 6:
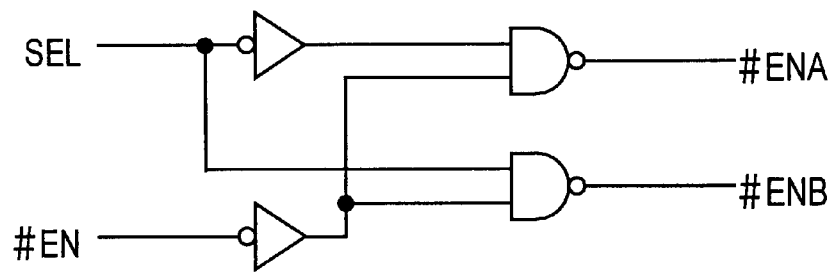
FIG. 6 is a view showing an example of circuit for generating enable signals #ENA and #ENB.

FIG. 6 shows an example of circuit for generating the enable signals #ENA and #ENB. As shown in FIG. 6, the generating circuit includes two NAND circuits and two inverters. The generating circuit generates the enable signals #ENA and #ENB by a selection signal SEL and an enable signal #EN.

The enable signal #EN is a signal for enabling selection of the buffer circuit 41 or 43. When the enable signal #EN is inactive, neither the buffer circuits 41 nor 43 is selected.

The selection signal SEL is a signal for designating a buffer circuit to be operated. For example, the selection signal SEL becomes "H" when the buffer circuit 41 is selected, while the selection signal SEL becomes "L" when the buffer circuit 43 is selected. Several examples of a circuit for generating the selection signal SEL will be described hereinafter.

EXAMPLE 1

Figure 7:
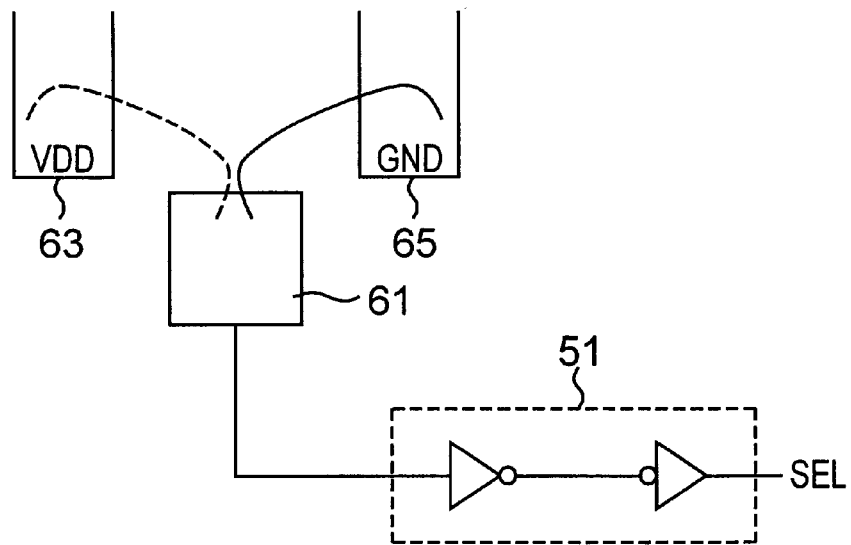
FIG. 7 is a view showing an example of selection signal generating circuit using an inner lead.

FIG. 7 shows a circuit for generating the selection signal SEL that utilizes a bonding option. The generating circuit 51 includes two inverters, and an input thereof is connected to an input pad 61. To generate a selection signal SEL of "H", the pad 61 is connected to a inner lead 63 which is connected to the power supply (VDD). On the other hand, to generate a selection signal SEL "L" is generated, the pad 61 is connected to an inner lead 65 which is connected to a ground (GND).

EXAMPLE 2

Figure 8:
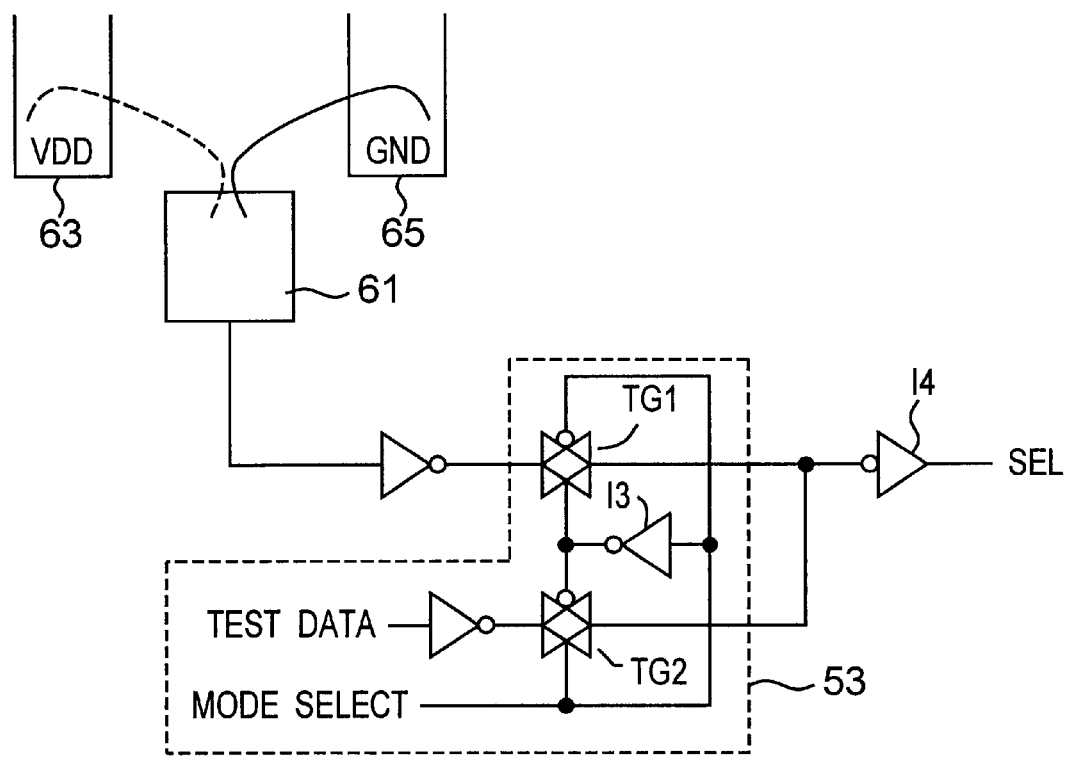
FIG. 8 is a view showing an example of the selection signal generating circuit using an inner lead, which can perform an operational test.

FIG. 8 shows a configuration in which a test of selection signal is possible in the circuit shown in FIG. 7. The configuration shown in FIG. 8 is provided with a mode selection circuit 53. The mode selection circuit 53 includes two transfer gates TG1 and TG2, and an inverter. By the inverter I3, complementary signals depending on a mode select signal are respectively input to the transfer gates TG1 and TG2. The mode select signal for setting a test mode and test data (selection signal for test) are input to the mode selection circuit 53.

During a test mode, the mode select signal becomes active (i.e., "H"). At this time, the transfer gate TG2 is turned on to transmit the test data as a selection signal to the inverter I4. The transfer gate TG1 is switched off to transmit no signal from the pad 61 to the inverter I4.

On the other hand, during a non-test mode, the mode select signal becomes inactive (i.e., "L"). At this time, the transfer gate TG1 is turned on to transmit the signal as a selection signal from the pad 61 to the inverter I4. The transfer gate TG2 is switched off to transmit no test data to the inverter I4.

According to this circuit configuration, an operational test for the buffer circuits 41 and 43 can be carried out by the selection signal input from outside before wiring between the inner lead and the pad.

EXAMPLE 3

Figure 9A:
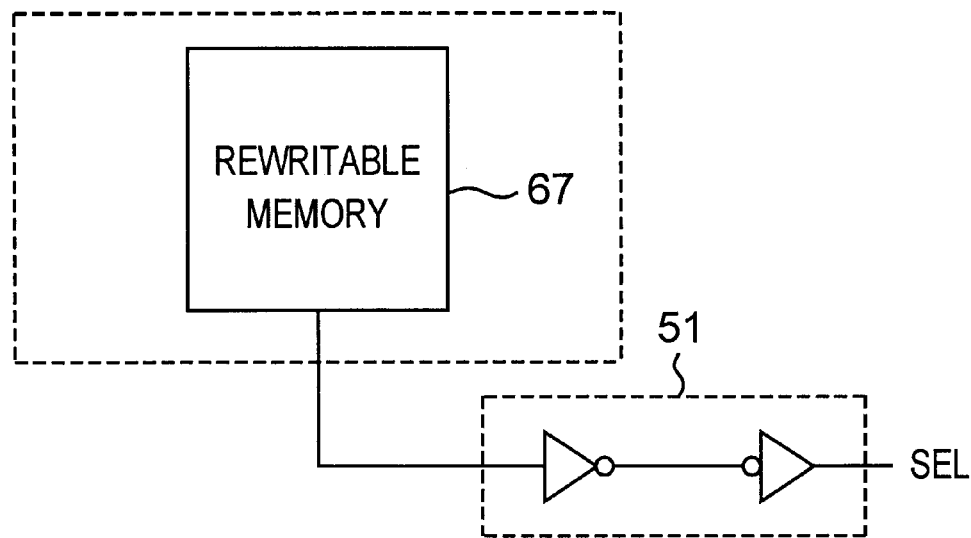
FIG. 9A is a view showing an example of the selection signal generating circuit having a memory circuit.
Figure 9B:
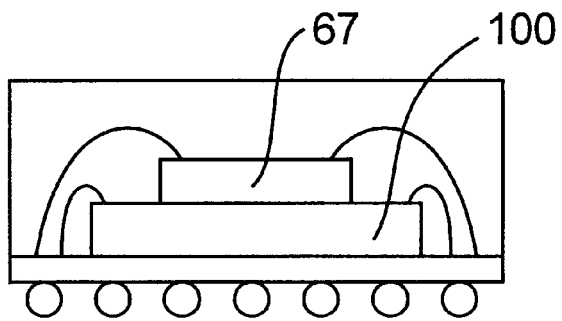
FIG. 9B is a view showing MCP storing the memory circuit and the semiconductor integrated circuit.

FIG. 9A shows a configuration for utilizing data stored in a memory circuit as a selection signal SEL. A memory circuit 67 is a rewritable memory, and has a predetermined storage area for recording data to provide the selection signal. The generating circuit 51 is connected to, e.g., a data line of the memory circuit 67 such that a read out signal is obtained from the predetermined storage area in which the selection signal data is recorded. By rewriting the recorded data of the memory circuit 67, a switching signal value can be varied optionally. The memory circuit 67 may be provided on the same chip as the semiconductor integrated circuit. Alternatively, a memory circuit provided outside may be utilized. At this case, the memory circuit 67 is preferably molded together with the semiconductor integrated circuit 100 to be stored in the same package, as shown in FIG. 9B.

Figure 10:
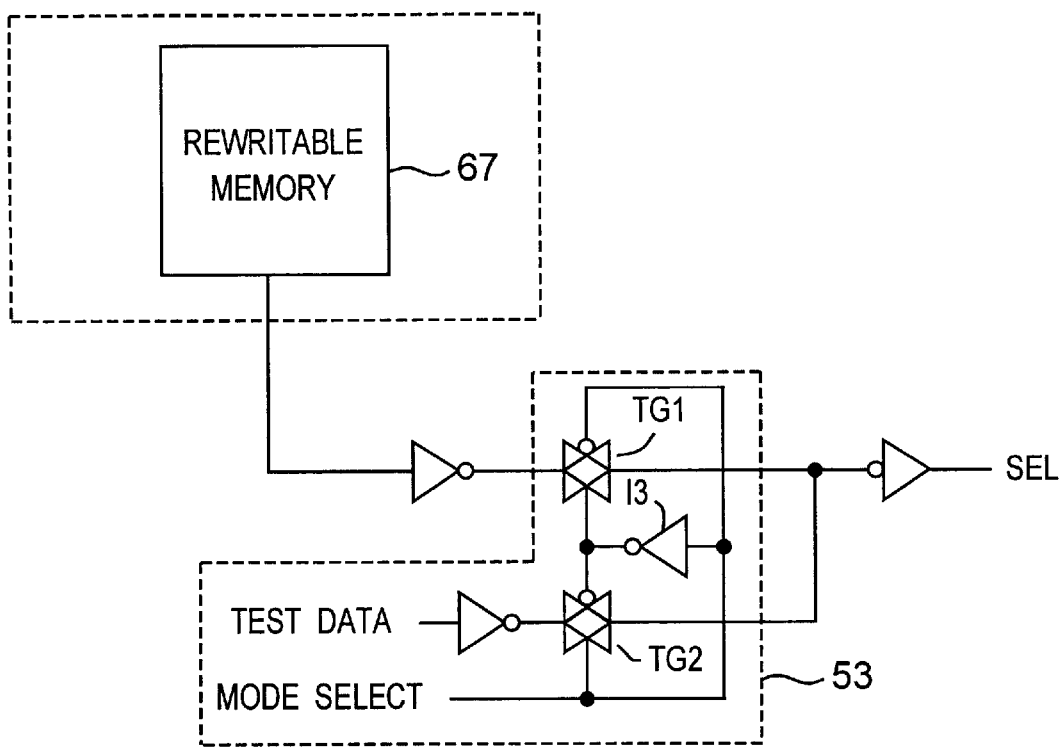
FIG. 10 is a view showing an example of the selection signal generating circuit having a memory circuit, which can perform the operational test.

In a circuit configuration shown in FIG. 10, the mode selection circuit 53 is added to the circuit configuration shown in FIG. 9. Such the configuration allows operation of the buffer circuits 41 and 43 in the input circuit 11b to be tested without writing data into the memory circuit 67.

EXAMPLE 4

Figure 11:
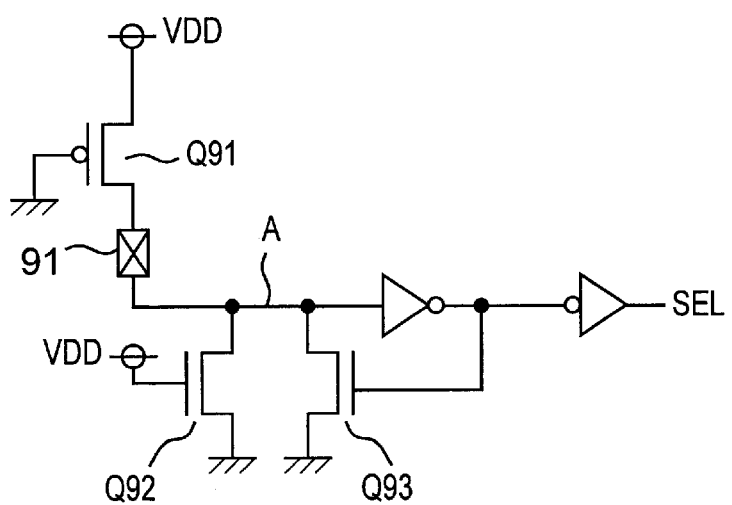
FIG. 11 is a view showing yet an example of the selection signal generating circuit having a fuse.

FIG. 11 shows a circuit configuration for generating a selection signal by using a fuse. A circuit shown in FIG. 11 includes a PMOS transistor Q91, a fuse 91, NMOS transistors Q92 and Q93, and two inverters. The power supply VDD, the PMOS transistor Q91, the fuse 91, and two inverters are serially connected. The parallel connected NMOS transistors Q92 and Q93 are interposed between a ground and a node A between the fuse 91 and the preceding inverter.

To output "H" as a selection signal SEL, the fuse 91 is rendered conductive. Thus, a node A becomes "H" to output the selection signal SEL of "H". To output "L" as the selection signal SEL, the fuse 91 is rendered disconnected not to be conductive. Thus, the node A becomes "L" to output the selection signal SEL of "L".

Figure 12:
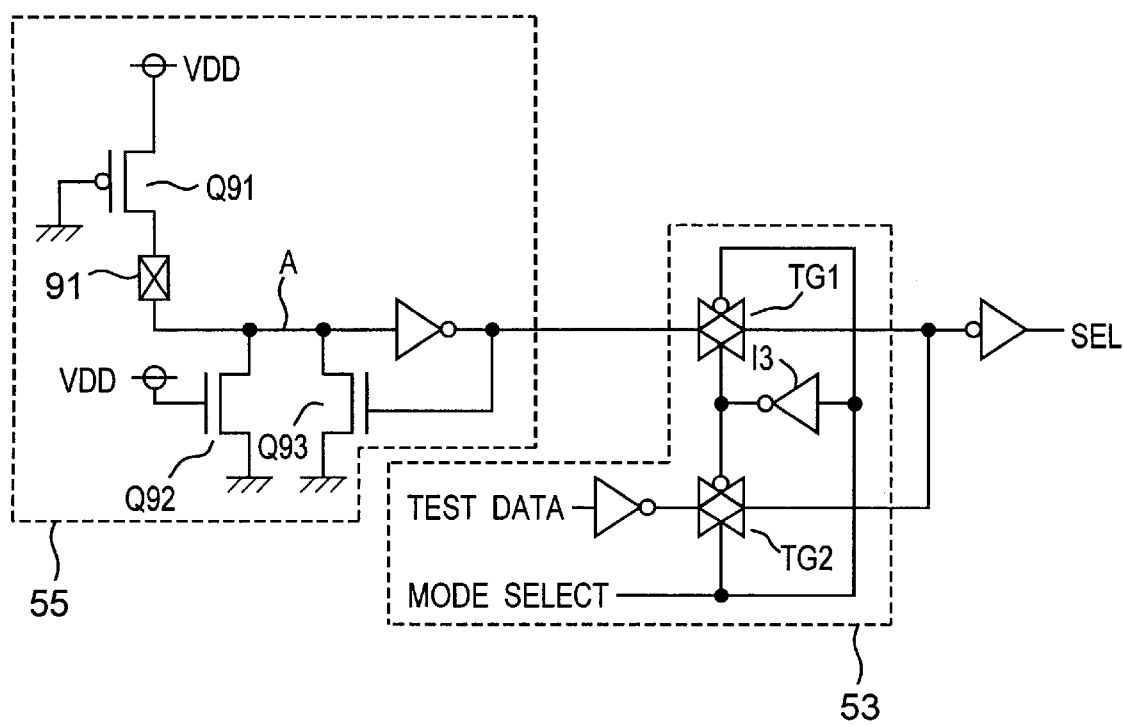
FIG. 12 is a view showing yet an example of the selection signal generating circuit having a fuse, which can perform the operational test.
Figure 13:
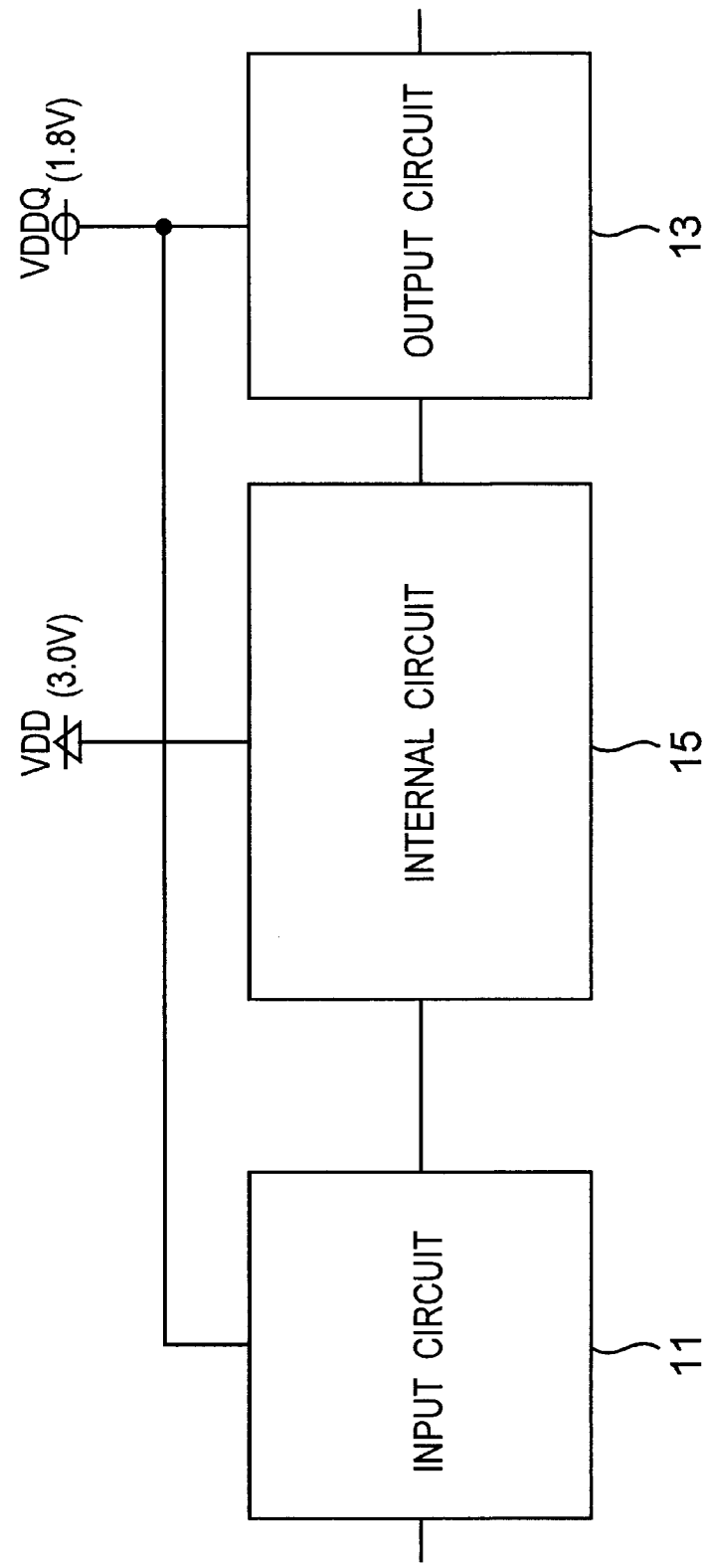
FIG. 13 is a structural view of conventional semiconductor integrated circuit.

In a configuration shown in FIG. 12, the mode selection circuit 53 is added to the circuit configuration shown in FIG. 11. Such circuit configuration allows the operation of the buffer circuits 41 and 43 in the input circuit 11b to be tested without disconnecting the fuse 91.

It is noted that, even if the input terminal is the same as the output terminal, the respective power supply voltages may be applied to the input circuit and the output circuit that are connected to the terminal.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application Nos. 2002-110784 and 2002-110786, filed on Apr. 12, 2002, which are expressly incorporated herein by reference in its entirety.

What is claimed is:

1. A semiconductor integrated circuit comprising:
    an input circuit that receives a signal;
    an internal circuit that applies a predetermined function to the received signal; and
    an output circuit that outputs the signal applied with the predetermined function,
    wherein a first power supply voltage and a second power supply voltage which is lower than the first power supply voltage are supplied to the semiconductor integrated circuit from the outside, a voltage obtained by decreasing the first power supply voltage is supplied to the input circuit, and the second power supply voltage is supplied to the output circuit.

2. The semiconductor integrated circuit according to claim 1 further comprising
    a first step-down circuit that decreases the first power supply voltage, and
    a second step-down circuit that decreases the voltage obtained by the first step-down circuit,
    wherein the voltage from the first step-down circuit is supplied to the internal circuit, and the voltage from the second step-down circuit is supplied to the input circuit.

3. The semiconductor integrated circuit according to claim 2, wherein the voltage from the second step-down circuit is within a range of a standard to a power supply voltage for input and output.

4. The semiconductor integrated circuit according to claim 1, wherein the second step-down circuit comprises an NMOS transistor, and decreases a voltage by using a threshold voltage of the NMOS transistor.

5. The semiconductor integrated circuit according to claim 1, wherein during normal operation, the first power supply voltage is supplied to the input circuit, while during an operation in a power down mode which is an operational mode for reducing current consumption within the integrated circuit, the second power supply voltage is supplied to the input circuit.

6. The semiconductor integrated circuit according to claim 1 further comprising a selection circuit that selects, as a power supply to be supplied to the input circuit, one of the first power supply voltage and the voltage which is obtained by decreasing the first power supply voltage.

7. The semiconductor integrated circuit according to claim 6, wherein the input circuit comprises a first buffer circuit that receives the first power supply voltage to operate and a second buffer circuit that receives the voltage obtained by decreasing the first power supply voltage to operate, and the selection circuit selects one of these buffer circuits according to a power supply supplied to the input circuit.

8. The semiconductor integrated circuit according to claim 6, wherein the selection circuit selects the power supply by a selection signal which is generated by electrically connecting an inner lead connected to a predetermined potential to a pad.

9. The semiconductor integrated circuit according to claim 6, wherein the selection circuit selects the power supply by a selection signal which is generated based on predetermined data recorded in a rewritable storage.

10. The semiconductor integrated circuit according to claim 9, wherein the rewritable storage is provided within another integrated circuit but is molded in the same package.

11. The semiconductor integrated circuit according to claim 6, wherein the selection circuit selects the power supply by a selection signal which is generated in accordance with electrical disconnection of a fuse.

* * * * *